United States Patent
Eskridge et al.

(10) Patent No.: US 8,502,327 B1
(45) Date of Patent: Aug. 6, 2013

(54) SYSTEMS AND METHODS FOR CONDUCTIVE PILLARS

(75) Inventors: Mark Eskridge, Renton, WA (US); James Christopher Milne, Issaquah, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/359,137

(22) Filed: Jan. 26, 2012

(51) Int. Cl.
*H01L 29/84* (2006.01)

(52) U.S. Cl.
USPC .............. 257/415; 257/416; 438/50

(58) Field of Classification Search
USPC .................. 257/415–420; 438/50
See application file for complete search history.

(56) References Cited

U.S. PATENT DOCUMENTS

| | | | |
|---|---|---|---|
| 6,635,509 B1 | 10/2003 | Ouellet | |
| 6,673,694 B2 | 1/2004 | Borenstein | |
| 7,253,082 B2 | 8/2007 | Adachi et al. | |
| 2005/0009233 A1 | 1/2005 | Park et al. | |
| 2005/0139967 A1* | 6/2005 | Eskridge et al. | 257/659 |
| 2005/0205951 A1* | 9/2005 | Eskridge | 257/416 |

* cited by examiner

*Primary Examiner* — Jami M Valentine
(74) *Attorney, Agent, or Firm* — Fogg & Powers LLC

(57) ABSTRACT

Systems and methods for conductive pillars are provided. In one embodiment, a system comprises an electrical board comprising an electrical device, and a packaged die, the packaged die bonded to the electrical board. The packaged die comprises a substrate layer, the substrate layer comprising a recessed area, a conductive trace, wherein a portion of the conductive trace is formed in the recessed area, and an epitaxial device layer bonded to the substrate layer. The device layer comprises a MEMS device, and an epitaxial conductive pillar, wherein a first side of the epitaxial conductive pillar is electrically connected to the conductive trace and the second side of the epitaxial conductive pillar is electrically connected to the electrical board, wherein the epitaxial conductive pillar extends through the epitaxial device layer to electrically couple the conductive trace to an interface surface on the epitaxial device layer.

10 Claims, 10 Drawing Sheets

SYSTEMS AND METHODS FOR CONDUCTIVE PILLARS

BACKGROUND

In flip-chip packaging, a device fabricated in one position is turned "upside down," before electrically connecting signal pads to the surface of a board or other substrate. Ideally, a flip-chip package, when mounted on a surface, has a footprint that is a similar size to the size of the chip itself. That is, a flip-chip package lacks a radial pattern of electrical connection around the chip package that increase the footprint of the chip package because the signal pads located on the mounting surface of the chip directly connect to the board. A problem occurs however when implementing certain MEMS devices in a flip-chip package. The MEMS device layer is typically formed as a top layer of the flip-chip package before it is flipped. In MEMS devices, the thickness of the MEMS layer can be substantially thick. Because of this substantial thickness, when the package is flipped, signal pads located on the substrate on which the MEMS device is formed may be too far from the top surface of the board to effectively bond with the surface of board to which the MEMS device is being mounted.

SUMMARY

The embodiments of the present invention provide systems and methods for conductive pillars and will be understood by reading and studying the following specification.

Systems and methods for conductive pillars are provided. In one embodiment a system comprises an electrical board comprising at least one electrical device, and a packaged die, the packaged die bonded to the electrical board. The packaged die comprises a substrate layer, the substrate layer comprising a recessed area, a conductive trace, wherein a portion of the conductive trace is formed in the recessed area, and an epitaxial device layer bonded to the substrate layer. The device layer comprises a micro-electromechanical system (MEMS) device, wherein a portion of the MEMS device is suspended over the recessed area, and at least one epitaxial conductive pillar, wherein a first side of the at least one epitaxial conductive pillar is electrically connected to the conductive trace and the second side of the at least one epitaxial conductive pillar is electrically connected to the electrical board, wherein the at least one epitaxial conductive pillar extends through the epitaxial device layer to electrically couple the conductive trace to an interface surface on the epitaxial device layer.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments provided in this disclosure describe systems and methods for providing electrical connectivity for MEMS devices implemented using flip-chip packages (in one example of a flip-chip package, the package is mounted using a Controlled Collapse Chip Connection or its acronym, C4. Other processes can also be used to mount flip-chip packages).

For example, in one embodiment, epitaxial conductive pillars are formed on a device surface of a supportive substrate as part of a device layer that includes the MEMS device. The epitaxial conductive pillars extend from conductive traces formed on the device surface of the supportive substrate to an interface surface of the device layer, approximately even with the top surface of the MEMS device. Alternatively, the conductive pillars extend beyond the interface surface of the device layer. Thus, the epitaxial conductive pillars provide electrical connectivity between conductive traces formed on the supportive substrate to the interface surface of the device layer. The epitaxial conductive pillars bridge the gap between the conductive traces and the interface surface of the device layer so that when the device is flipped for mounting onto a board, the conductive traces can be coupled to external circuits through the epitaxial conductive pillars. Further, when the conductive pillars extend beyond the interface surface of the MEMS device, the conductive pillars provide additional space for the movement of the MEMS device.

Figure 1:
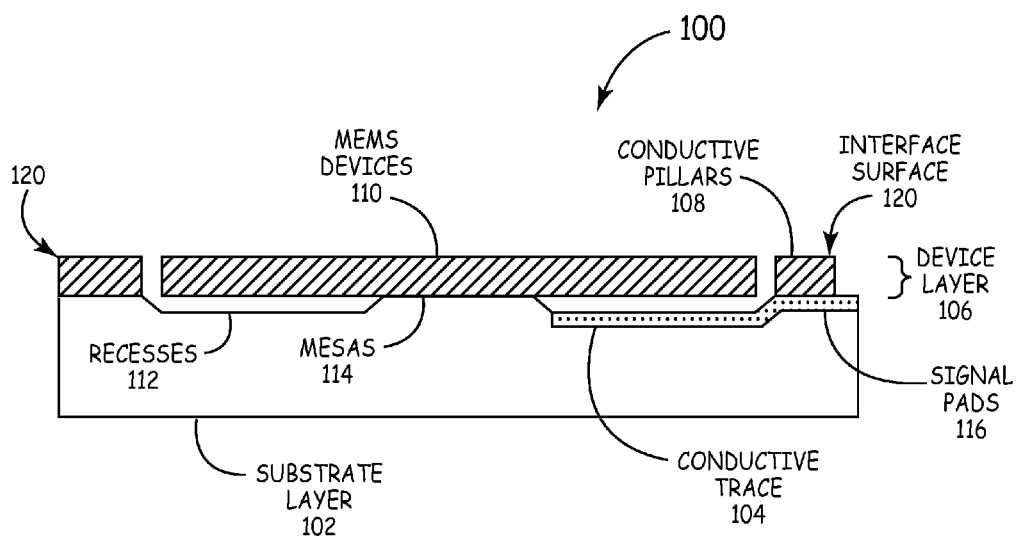
FIG. 1 is a block diagram of a die having a conductive pillar of one embodiment of the present invention.

FIG. 1 is a block diagram of a die 100 of one embodiment of the present invention comprising a MEMS device 110 bonded on top of a substrate layer 102. As used herein, substrate layer 102 refers to a layer that provides structural support to the remaining die 100 components. In at least one embodiment, substrate layer 102 is made from a rigid non-conductive material, such as but not limited to a silicon glass, a ceramic, and the like. In an additional embodiment, the substrate layer 102 is fabricated from a conductive material. As shown in FIG. 1, substrate layer 102 supports microelectromechanical systems (MEMS) device 110. The phrase "MEMS device," as used herein, refers to an electrical component that has integrated miniaturized mechanical devices for sensing, processing, or carrying out various functions. For example, MEMS device 110 can be an accelerometer, a gyroscope, and the like.

Because substrate layer 102 supports devices having mechanical portions, substrate layer 102 includes one or more recesses 112. Recesses 112 are areas where a portion of the material that comprises substrate layer 102 has been removed from the device surface of substrate layer 102 to allow freedom of motion to mechanical components of MEMS device 110. Recesses 112 also provide space for forming electronic interconnects (such as conductive trace 104) on the device surface of substrate layer 102 that connect MEMS device 110 and substrate layer 102. Substrate layer 102 also includes one or more mesas 114. In at least one exemplary embodiment, mesas 114 are a portion of substrate layer 102 where material from the device surface of substrate layer 102 remains after the formation of recesses 112. In some implementations, mesas 114 bond to non-moving portions of MEMS device 110. Thus, in one embodiment, MEMS device 110 bonds to substrate layer 102 by bonding to mesas 114. In an additional embodiment, when substrate layer 102 is fabricated from a conductive material, substrate layer 102 is electrically isolated from electronic interconnects (such as conductive trace 104) and the MEMS device 110.

As illustrated in the embodiment shown in FIG. 1, conductive trace 104 is a region on the top surface of substrate layer 102 where conductive material has been deposited. Conductive trace 104 allows the transmission of electrical signals along the top surface of substrate layer 102. For example, in certain implementations, conductive trace 104 acts as a sense electrode for sensing movement of a MEMS device 110. Alternatively, conductive trace 104 functions to conduct electricity from one region on substrate layer 102 to another region. In some implementations, conductive trace 104 extends from an area in recesses 112 onto mesas 114. When conductive trace 104 extends onto a mesa 114, conductive trace 104 forms a signal pad 116. Signal pad 116 is an electrically conductive region on substrate layer 102 designed to electrically connect to an off-chip surface. In certain implementations, conductive trace 104 and signal pads 116 are made from a metal or other conductive material.

MEMS device 110 is bonded to substrate layer 102 in a layer of die 100 referred to herein as a device layer 106. That is, device layer 106 is a layer of epitaxial material on substrate layer 102 that includes MEMS device 110. As such, the terms "epitaxial layer" and "device layer" are used synonymously throughout this description. In order to provide means for electrical connectivity between conductive trace 104 to and the surface of device layer 106, a portion of semiconductive material in device layer 106 is formed as an epitaxial conductive pillar 108. Conductive pillar 108 is a portion of conductive epitaxial material fabricated along with MEMS device 110 as part of device layer 106. Conductive pillar 108 electrically connects a signal pad 116 coupled to conductive trace 104 to the interface surface 120 of device layer 106. Interface surface 120 thus provides an interface from which die 100 can interconnect with off-chip circuits. In other words, when die 100 is bonded to a surface such as a circuit board in a flip-chip configuration, conductive pillar 108 bridges the gap between signal pad 116 and the interface surface 120 of device layer 110, to facilitate electrical connections between signal pad 116 and an external circuit.

Figure 2:
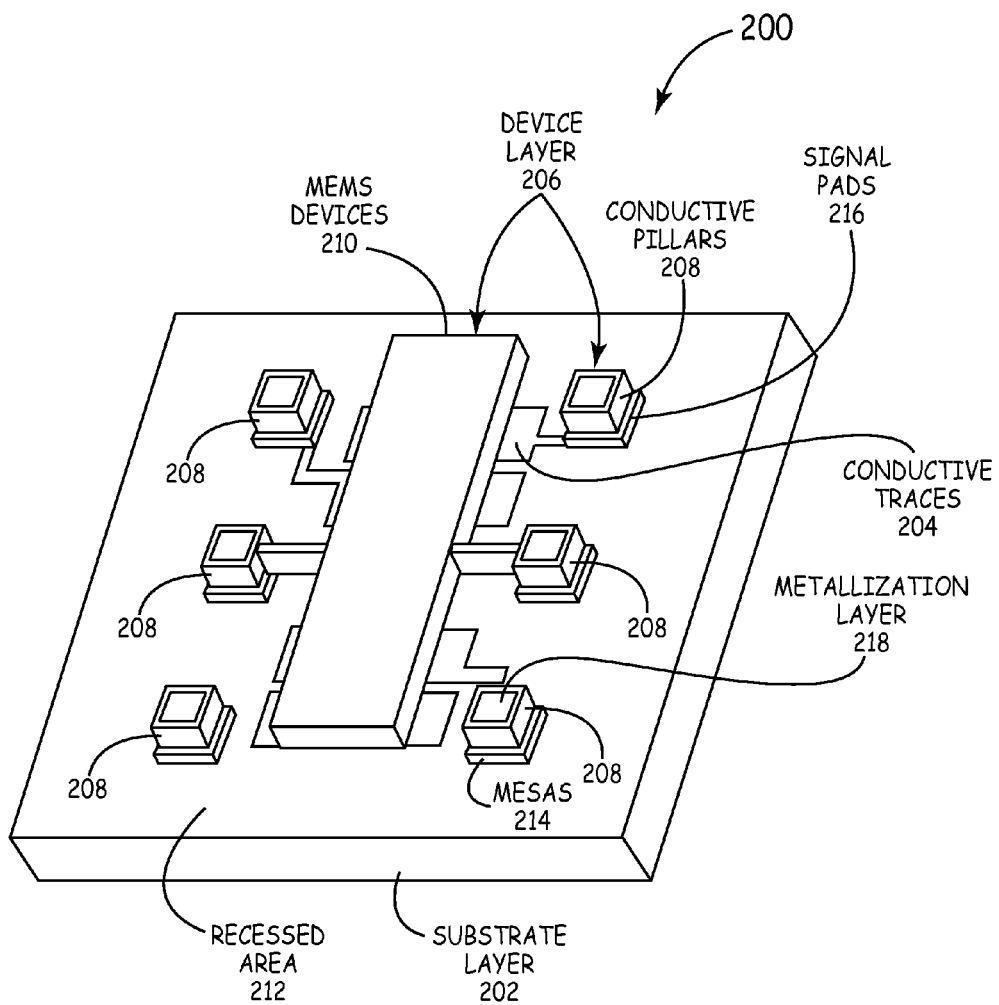
FIG. 2 is a perspective view of a MEMS device implemented using conductive pillars of one embodiment of the present invention.

FIG. 2 is a perspective view of a die 200 of one embodiment of the present invention. Die 200 comprises a MEMS device 210 bonded to a substrate layer 202 and is implemented using epitaxial conductive pillars 208 such as described above with respect to die 100 in FIG. 1. MEMS device 210 and the conductive pillars 208 collectively form the device layer 206 of die 200. Substrate layer 202 includes at least one recessed area 212 and a plurality of mesas 214 positioned within the recessed area 212. In one embodiment, recessed area 212 extends substantially over the device surface of substrate layer 202. In the embodiment shown in FIG. 2, multiple mesas 214 (i.e., regions of the device surface that have not been recessed) provide physical and electrical connection points for both conductive pillars 208 and MEMS device 210.

In order to provide electrical connection points on mesas 214, conductive traces 204 are formed in recessed area 212 of substrate layer 202. In one embodiment, the conductive traces 204 are electrodes that facilitate functions such as sensing or driving the motion of MEMS device 210. The conductive material used to form conductive traces 204 is also deposited on portions of the top surface of mesas 214 to form signal pads 216 electrically coupled to conductive traces 204. Signal pads 216 are similar to signal pads 116 in FIG. 1.

For the reasons explained above, when die 200 is mounted in a flip-chip configuration the thickness of MEMS device 210 can prevent signal pads 216 from being near enough to the interface surface of die 200 to form an effective electrical connection with surfaces found off of die 200. To form electrical connections between signal pads 216 and external surfaces, the conductive pillars 208 are bonded to signal pads 216. The conductive pillars 208 conductively contact signal pads 216 and electrically connect signal pads 216 and conductive traces 204 and provide electrical connection points approximately even with the interface surface of MEMS device 210. Because the electrical connections are extended from signal pads 216 to the interface surface of the device layer containing MEMS device 210, conductive pillars 208 facilitate external electrical connections to die 200 in a flip-chip configuration. In certain embodiments, a metallization layer 218 is formed on the top surfaces of conductive pillars 208 to further enhance the quality of the electrical contact between the signal pad 216 and an external connection.

Figure 3:
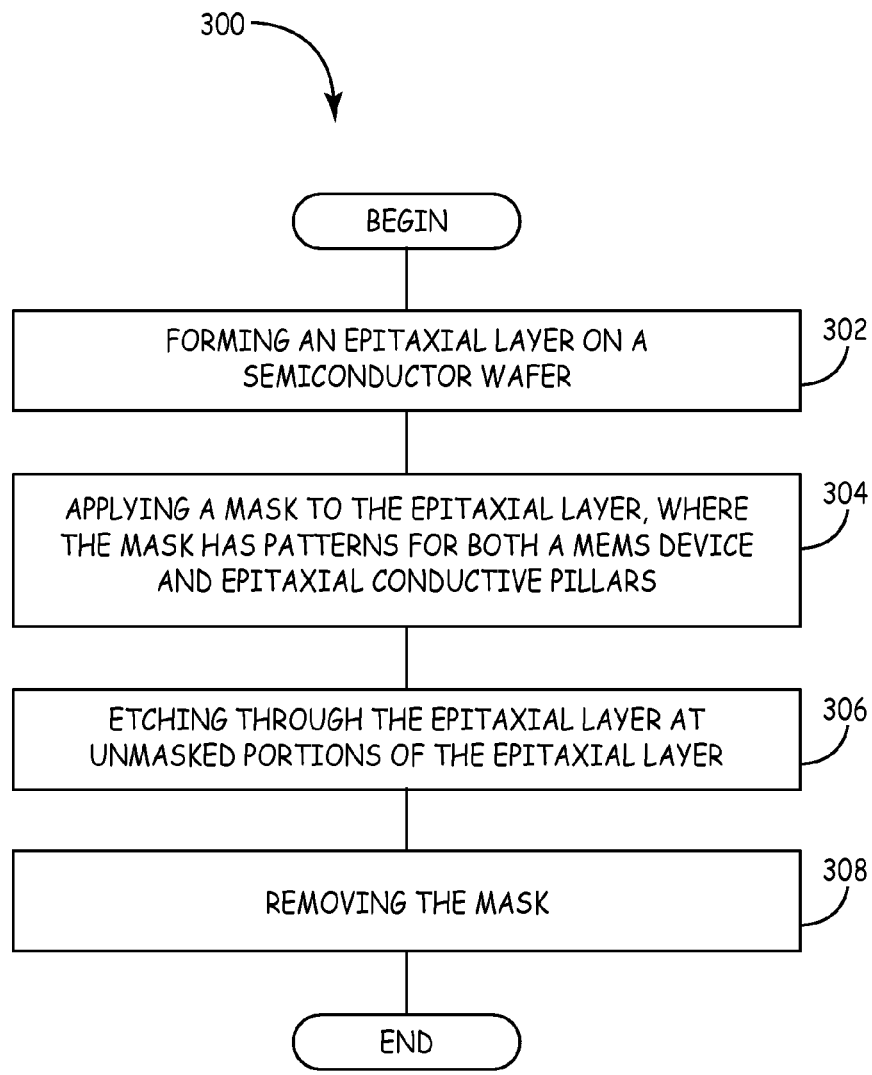
FIG. 3 is a flow diagram illustrating a method for fabricating MEMS device and conductive pillars in an epitaxial layer of one embodiment of the present invention.

FIG. 3 is a flow diagram of one embodiment of a method 300 for fabricating a MEMS device and conductive pillars in an epitaxial layer such as shown in the device layer 106 in FIG. 1, or the device layer 206 of FIG. 2. The method begins at 302 by forming an epitaxial layer on a semiconductor wafer. For example, an epitaxial layer is formed from a conductive material on a silicon wafer. Alternatively, the epitaxial layer and the silicon wafer are separated by a non-conducting layer. Method 300 proceeds with 304 by applying a mask to the epitaxial layer, where the mask has patterns for both at least one MEMS device and epitaxial conductive pillars. For example, to form MEMS devices and conductive pillars in the epitaxial layer, a mask is applied to the exposed surface of the epitaxial layer, where the masked regions correspond to regions of epitaxial layer that will form the MEMS device and the conductive pillars.

Method 300 proceeds with 306 by etching through the epitaxial layer at unmasked portions of the epitaxial layer. For example, a liquid or plasma etchant is applied to the surface of the masked epitaxial layer. The etchant removes regions of the epitaxial layer that are exposed by the mask. Further, the etchant is left on the epitaxial layer until the etchant has removed the epitaxial layer at the regions exposed by the mask. In some implementations, the etchant also removes a portion of the semiconductor wafer under the epitaxial layer to ensure that the epitaxial layer is entirely removed at the regions exposed by the mask. In at least one embodiment, a further nonconductive oxide layer exists between the semiconductor wafer and the epitaxial layer. When the nonconductive oxide layer isolates the epitaxial layer from the semiconductor wafer, an etchant is also used to remove the nonconductive oxide layer at the regions exposed through the mask and epitaxial layer. Method 300 proceeds with 308 by removing the mask. When the etchant has removed enough material from epitaxial layer, the etchant is removed and the mask is removed. The etching of the epitaxial layer, thus, forming a pattern in the epitaxial layer that includes the MEMS device and the conductive pillars bonded to the semiconductor wafer.

Figure 4:
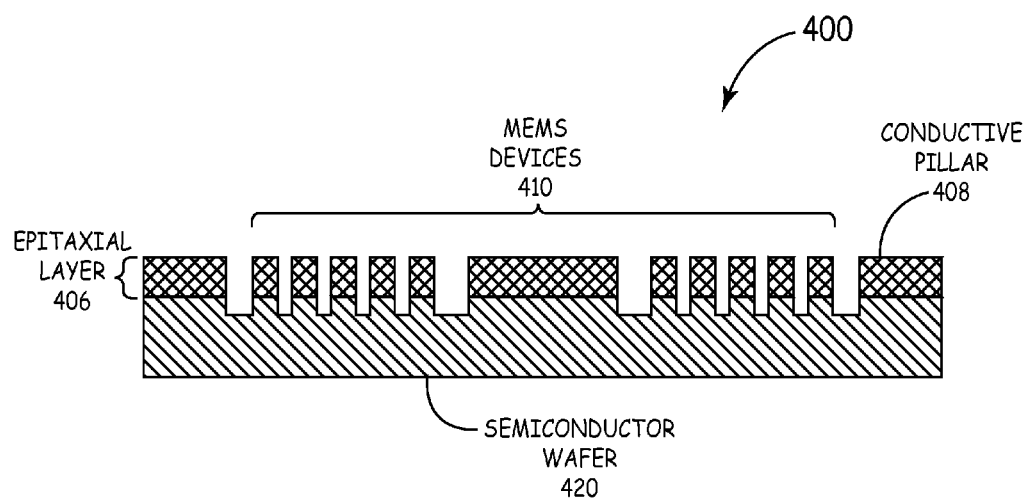
FIG. 4 is a diagram illustrating MEMS devices and conductive pillars formed in an epitaxial layer of one embodiment of the present invention.

FIG. 4 is a diagram illustrating one embodiment of a device 400 formed according to method 300 in FIG. 3. Device 400 includes a semiconductor wafer 420. At block 302 of method 300, epitaxial layer 406 is formed on the top surface of semiconductor wafer 420. Epitaxial layer 406 is made from a conductive material. After the masking and etching performed in block 304 and 306, epitaxial layer 406 will include both MEMS devices 410 and epitaxial conductive pillars 408. As shown, at one or more location, the pattern etched into epitaxial layer 406 extends through epitaxial layer 406 and penetrates into a top portion of semiconductor wafer 420.

Figure 5:
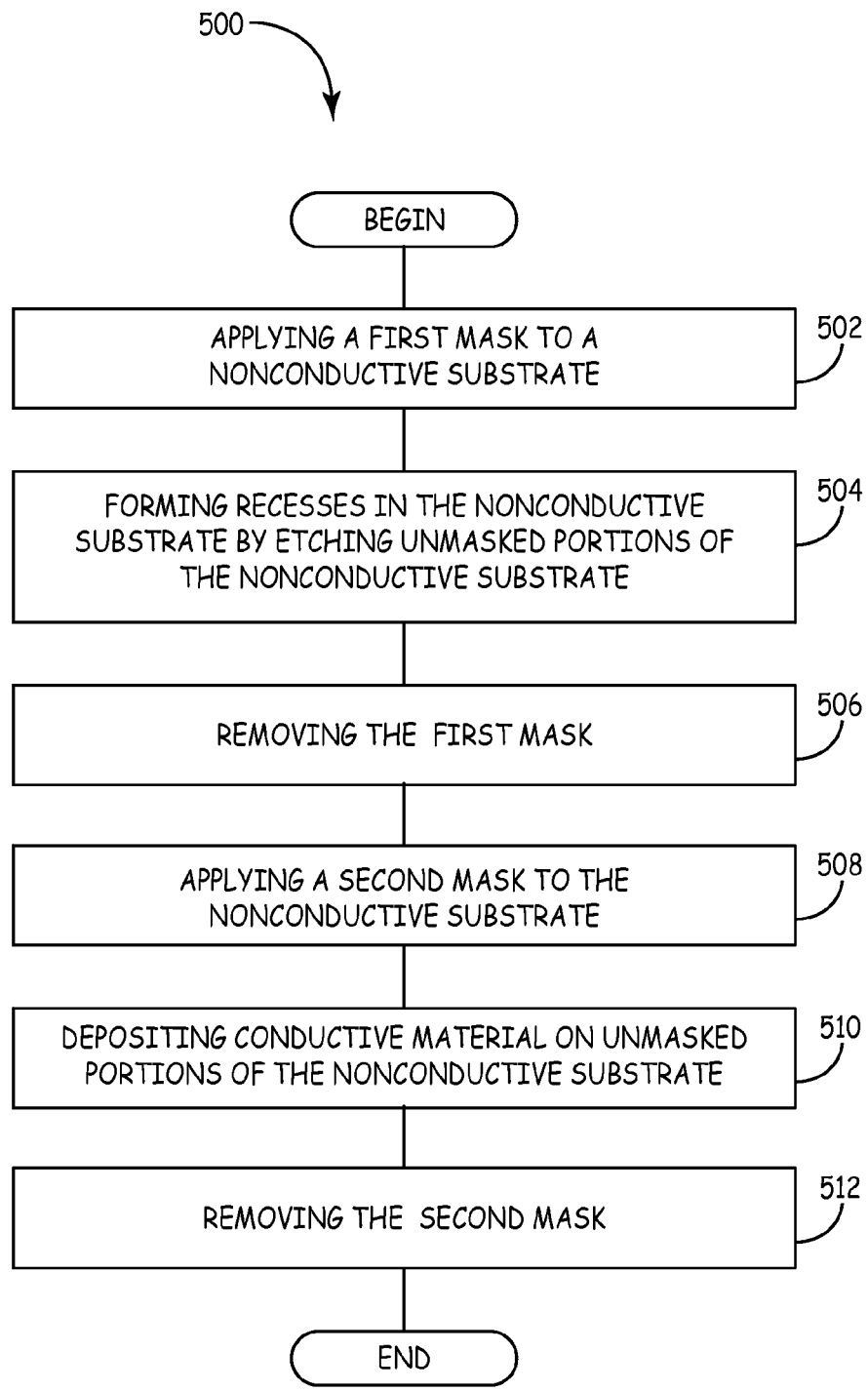
FIG. 5 is a flow diagram illustrating a method for fabricating a substrate layer of one embodiment of the present invention.

FIG. 5 is a flow diagram of one embodiment of a method 500 for fabricating a substrate layer for supporting MEMS devices, such a substrate layer 102 of FIG. 1 or substrate layer 202 of FIG. 2. In certain embodiments, the method begins at 502, with applying a first mask to a nonconductive substrate. The nonconductive substrate is made from a rigid nonconductive material such as glass. The first mask is applied to the device surface of the nonconductive substrate to control which portions of the device surface remain and which portions are recessed in subsequent processing. In an alternative embodiment, the nonconductive substrate is fabricated from conductive material, with a nonconductive layer that separates the conductive material from other conductive components that exist are formed on the nonconductive substrate. Method 500 proceeds at 504 with forming recesses in the nonconductive substrate by etching unmasked portions of the nonconductive substrate. Method 500 proceeds at 506 with removing the first mask.

In an alternative embodiment, where the substrate layer 202 is fabricated from a conductive material, the first mask is applied to the substrate layer to control which portions of the device surface remain and which portions are recessed in subsequent processing. The unmasked portions of the conductive substrate are etched. When the unmasked portions are etched, the mask is removed. Upon removal of the mask, nonconductive material is deposited on the top surface of the substrate layer. In some implementations, the nonconductive material is deposited over the top surface of the entire substrate layer. In alternative implementations, the nonconductive material is deposited over selected regions of the substrate layer. For example, the nonconductive material is deposited through masking at regions that will isolate interconnects and other devices that will bond to the substrate layer.

Method 500 then proceeds at 508 with applying a second mask to the nonconductive substrate. Whereas the first mask exposed regions for the removal of material from the device surface of the nonconductive substrate, the second mask exposes regions where material is added to the device surface of the nonconductive substrate. Method 500 proceeds at 510 with depositing conductive material on unmasked portion of the nonconductive substrate. In one implementation, the conductive material is deposited to form conductive traces that provide electrical conductivity to desired regions of the etched surface of the nonconductive substrate. For example, a conductive trace is formed that provides an electrical connection that extends from a non-recessed portion of the etched surface of nonconductive substrate to a recessed portion of the etched surface of the nonconductive substrate. Further, method 500 proceeds at 512 with removing the second mask.

In an alternative embodiment, the conductive material is deposited as a layer over the nonconductive substrate. When the conductive material is deposited, a mask is applied and the conductive material is removed at the regions exposed through the mask. In a further alternative embodiment, the conductive material is patterned onto the nonconductive substrate using a shadow mask. In certain implementations, the formation of the conductive traces and other electrical connections on the nonconductive substrate can include multiple steps that include deposition, etching, or the use of a shadow mask. Further, the formation of the conductive traces and other electrical connections may require repeated depositions to realize a desired pattern.

Figure 6:
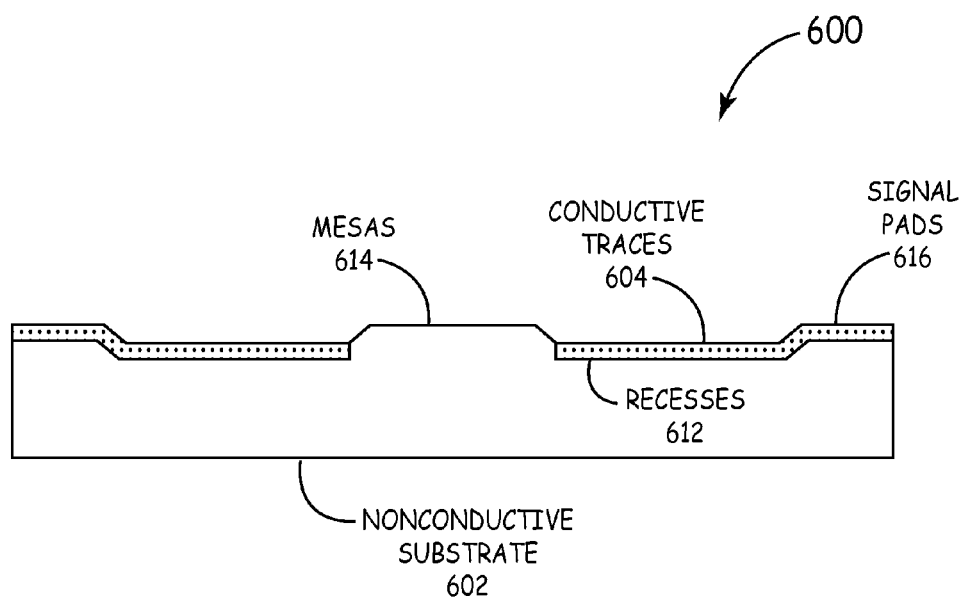
FIG. 6 is a diagram illustrating the formation of a substrate layer for supporting MEMS devices of one embodiment of the present invention.

FIG. 6 is a diagram illustrating one embodiment of a device 600 formed according to method 500 in FIG. 5. Device 600 includes a nonconductive substrate 602. Nonconductive substrate 602 is composed of a material that includes glass, ceramic, and the like. As was stated above, nonconductive substrate 602 may also include a conductive material covered with a nonconductive layer. Blocks 502 to 506 form the recesses 612 in the nonconductive substrate 602. That is, the recesses 612 are regions in the etched surface of nonconductive substrate 602 where material has been removed. Mesas 614 illustrate those regions where material has not been removed through process steps described in blocks 502-506. Conductive traces 604 are regions formed by process steps described in blocks 508-512 where conductive material was deposited on the etched surface of nonconductive substrate 602. In some embodiments, conductive traces 604 may be deposited into recesses 612. In some embodiments, conductive traces 604 will extend from recesses 612 to mesas 614. The depositing of conductive material at block 510, in some embodiments includes depositing of signal pads 616. Signal pads 616 are regions of conductive traces 604 that are formed on mesas 614 that provide a location for conductive traces 604 to electrically connect to an external electrical connection.

Figure 7:
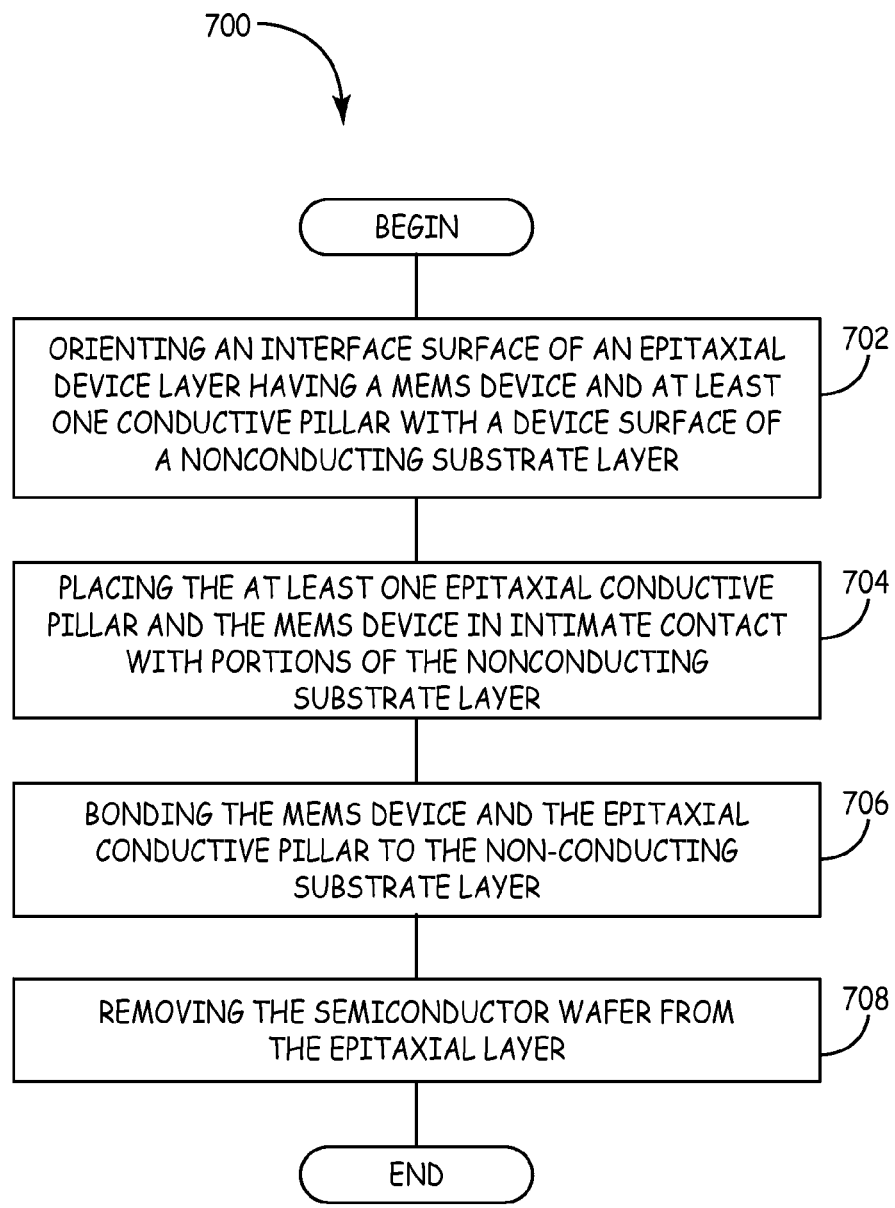
FIG. 7 is a flow diagram illustrating a method for bonding an epitaxial layer to a supportive substrate of one embodiment of the present invention.

FIG. 7 is a flow diagram of one embodiment of a method 700 for forming a device by bonding the epitaxial device layer that includes the MEMS device and conductive pillars formed by method 300 with the substrate layer for supporting MEMS devices formed by method 500. Method 700 begins at 702 with orienting an interface surface of an epitaxial device layer having a MEMS device and at least one conductive pillar with a device surface of a nonconducting substrate layer. The method proceeds to 704 with placing the at least one epitaxial conductive pillar and the MEMS device in contact with portions of the nonconducting substrate layer. In at least one embodiment, the epitaxial conductive pillar is placed in intimate contact with a region of the nonconducting substrate that surrounds a signal pad on a mesa. Further, a portion of the MEMS device is brought in intimate contact with a region of the nonconducting substrate that is on a mesa. The method proceeds to 706 with bonding the MEMS device and the epitaxial conductive pillar to the nonconducting substrate layer. The different surfaces are bonded to one another using well known bonding techniques such as anodic bonding, direct bonding, thermocompression bonding, and the like. Method 700 proceeds at 708 by removing the semiconductor wafer from the epitaxial layer. For example, as shown in FIG. 8, the semiconductor wafer 420 was removed from the epitaxial layer 406 to liberate moveable portions of the MEMS device 410 formed in the epitaxial layer 406.

Figure 8:
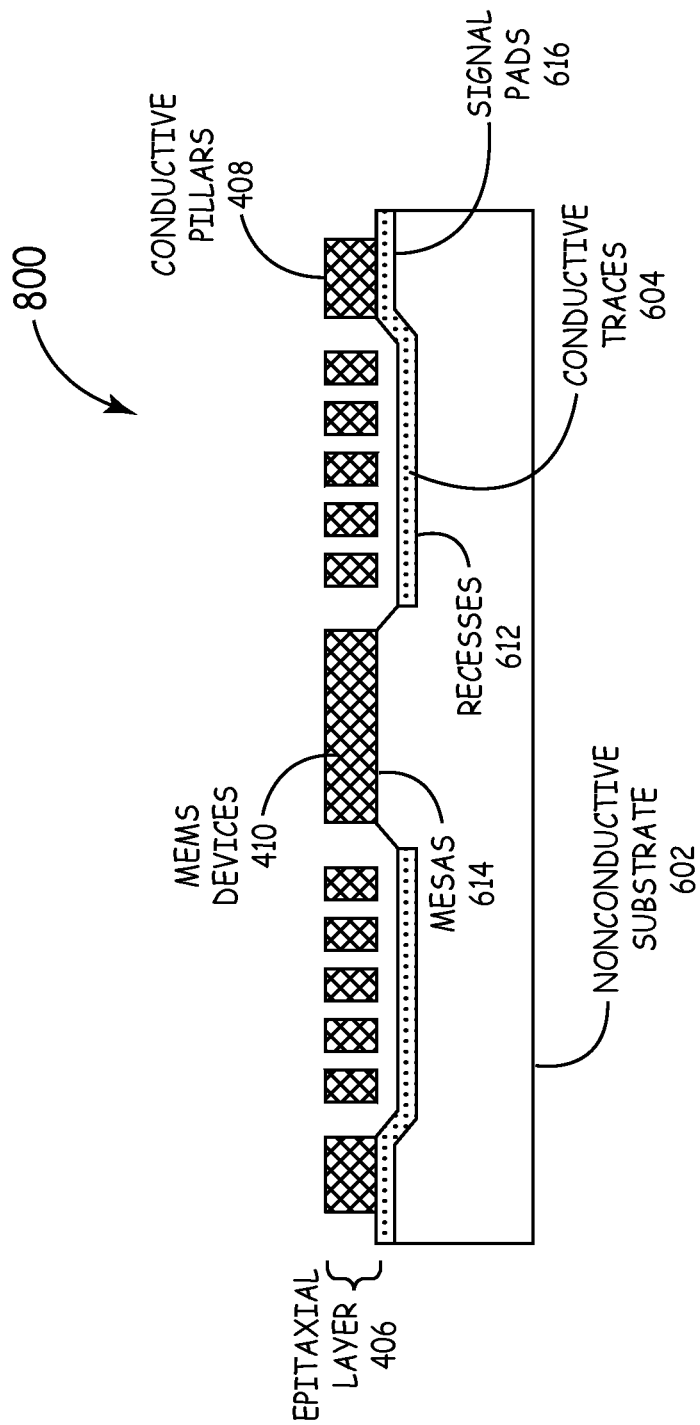
FIG. 8 is a diagram illustrating the fabrication of a MEMS device of one embodiment of the present invention.

FIG. 8 is a diagram illustrating one embodiment of a device 800 formed according to methods set forth in FIGS. 3-7. Epitaxial layer 406 is bonded to the non-recessed portions of a surface of nonconductive substrate 602. MEMS devices 410 are bonded to mesas 614. In one embodiment where MEMS device 410 includes a moveable portion, the mesas allow moveable portions of MEMS device 410 to be suspended over recesses 612. Epitaxial conductive pillars 408 are bonded to signal pads 616 to extend the electrical paths from signal pads 616 through the device layer defined by epitaxial layer 406.

Figure 9:
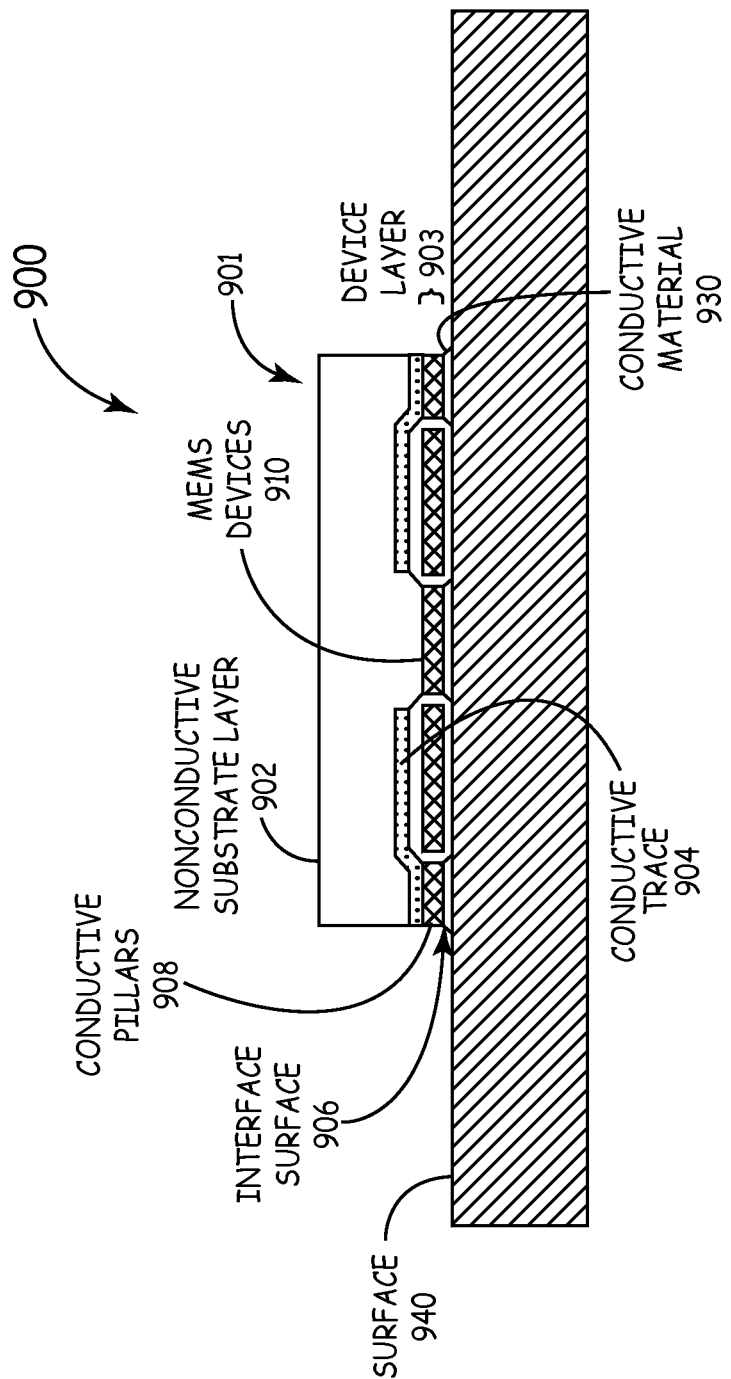
FIG. 9 is a block diagram illustrating the mounting of a MEMS device of one embodiment of the present invention.

FIG. 9 is a block diagram illustrating one embodiment of a die 901, such as any of those described in FIGS. 1-8 above, mounted to a surface 940 (such as the surface of a printed circuit board, for example) using flip-chip mounting. Die 901 comprises a nonconducting substrate layer 902 and an epitaxial device layer 903. In one embodiment, die 901 is fabricated using the methods described with respect to FIGS. 3-8.

As described in the descriptions and embodiment above, the epitaxial conductive pillar 908 functions to extend an electrical connection through device layer 903 from a conductive trace 904 within nonconducting substrate layer 902 to an interface surface 906 of die 901 in order to reach surface 940. In at least one implementation, the interface surface 906 of conductive pillar 908 is electrically connected to surface 940 through conductive material 930. Conductive material 930 electrically connects conductive pillars 908 to surface 940 and also physically secures MEMS die 901 to surface 940. Conductive material 930 may include materials such as, but not limited to, solder, gold bumps, and the like.

Figure 10:
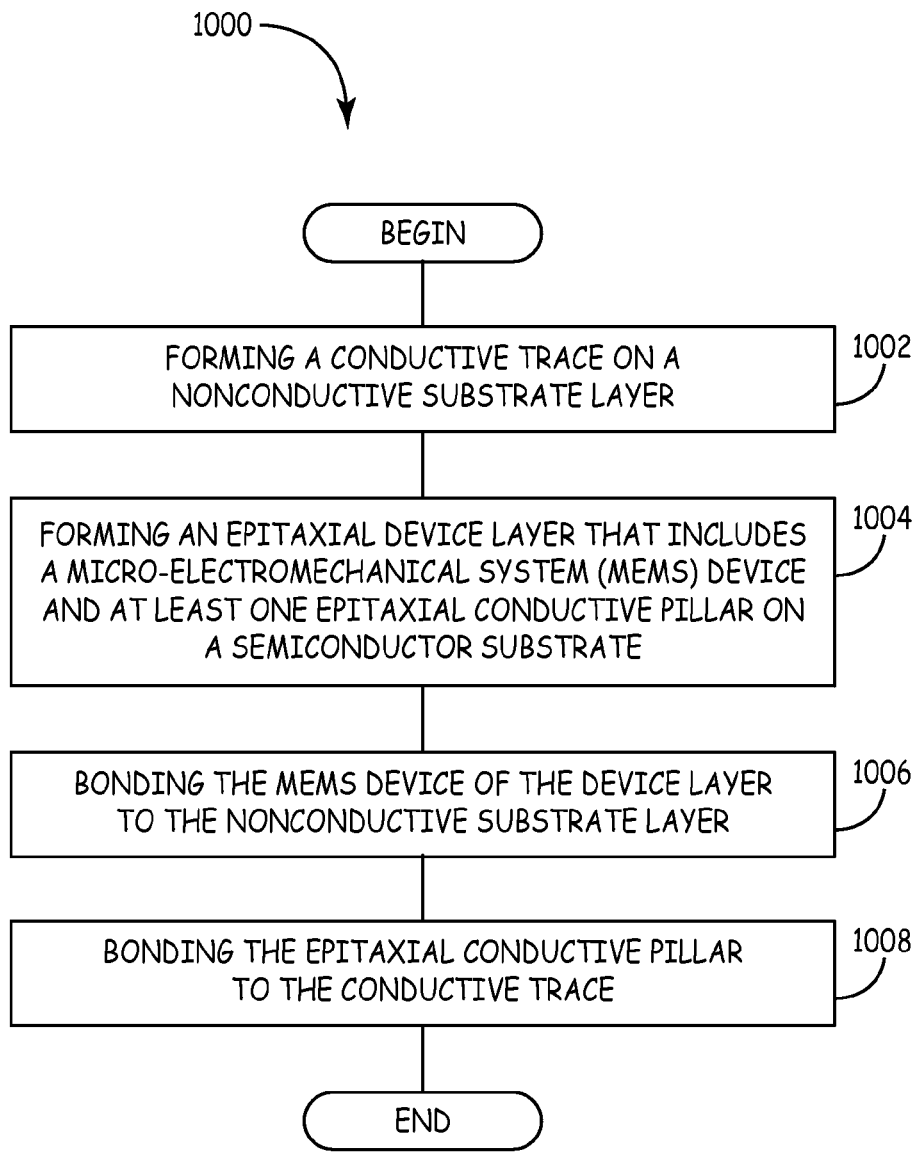
FIG. 10 is a flow diagram illustrating a method for fabricating a MEMS device of one embodiment of the present invention.

FIG. 10 is a high-level flow diagram of one embodiment of a method 1000 for fabricating a MEMS device that incorporates epitaxial conductive pillars. Method 1000 may be applied in conjunction with any of those embodiments described above. The method begins at 1002 where a conductive trace is formed on a nonconductive substrate layer. In some implementations, the conductive trace is formed within the upper surface of the substrate layer. The conductive trace may also be formed within a recessed area on the nonconductive substrate layer. In one embodiment where the conductive trace is formed within a recessed area, the conductive trace extends to a non-recessed area, such as a mesa. The portion of the conductive trace that is on the non-recessed area may form an electrical signal pad.

Method 1000 proceeds with 1004 by forming an epitaxial device layer that includes a MEMS device and at least one epitaxial conductive pillar on a supportive substrate. For example, in one embodiment a MEMS device and conductive pillar are formed in an epitaxial layer on a silicon wafer. As would be appreciated by one of ordinary skill in the art upon reading this specification, the order illustrated for block 1002 and 1004 are not meant to be limiting. That is, the processes can comprise performing block 1002 before block 1004, or after block 1004. Alternately, blocks 1002 and 1004 can be performed at least in part concurrently.

The method next proceeds to 1006 and 1008 where the MEMS device of the device layer is bonded to the nonconductive substrate layer and the conductive pillar is bonded to the conductive trace. In some embodiments, anodic bonding is used for bonding the MEMS device and the conductive pillars to the substrate layer and the conductive trace respectively. In some embodiments, the supportive substrate is then optionally removed from the epitaxial layer so that mechanical portions of the MEMS device are able to move. By bonding the conductive pillar to the conductive trace, the conductive pillar provides an electrical connection to the conductive trace that is located on the interface surface of the device layer. As the electrical connection is located on the interface surface of the device layer, the electrical connection can be bonded to other conductive surfaces in a flip-chip configuration without interfering with the operation of the MEMS device.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. An apparatus, the apparatus comprising:
   a substrate layer having at least one conductive trace on a surface thereon; and
   an epitaxial device layer having a first side and an opposing second side, the first side of the epitaxial device layer bonded to the substrate layer, the epitaxial device layer comprising:
   at least one micro-electromechanical system (MEMS) device; and
   at least one epitaxial conductive pillar, wherein a first side of the at least one epitaxial conductive pillar is electrically connected to the at least one conductive trace and an opposing second side of the at least one epitaxial conductive pillar is mounted to an external circuit board, wherein the at least one epitaxial conductive pillar extends through the epitaxial device layer to electrically couple the at least one conductive trace to an interface surface on the second side of the epitaxial device layer.

2. The apparatus of claim 1, wherein the substrate layer comprises at least one recessed area and at least one mesa, wherein a first mesa of the at least one mesa is bonded to the first side of the epitaxial device layer.

3. The apparatus of claim 2, wherein the conductive trace extends from a top surface of a second mesa to a surface of the substrate layer in the recessed area.

4. The apparatus of claim 2, wherein the recessed area is positioned under a moveable portion of the MEMS device.

5. The apparatus of claim 1, wherein the at least one epitaxial conductive pillar provides an electrical connection to an external circuit.

6. The apparatus of claim 5, further comprising a metallization layer formed on the top surface of the at least one epitaxial conductive pillar.

7. The apparatus of claim 5, wherein the at least one epitaxial conductive pillar is electrically connected to an electrical board, where the substrate layer and epitaxial device layer are part of a packaged die in a flip-chip configuration.

8. The apparatus of claim 1, wherein a height of the at least one epitaxial conductive pillar is greater than a thickness of the MEMS device.

9. An electrical system, the system comprising:
   an electrical board comprising at least one electrical device;
   a packaged die, the packaged die bonded to the electrical board, the packaged die comprising:
   a substrate layer, the substrate layer comprising a recessed area;

a conductive trace, wherein a portion of the conductive trace is formed in the recessed area; and an epitaxial device layer bonded to the substrate layer, the device layer comprising:

a micro-electromechanical system (MEMS) device, wherein a portion of the MEMS device is suspended over the recessed area; and at least one epitaxial conductive pillar, wherein a first side of the at least one epitaxial conductive pillar is electrically connected to the conductive trace and the second side of the at least one epitaxial conductive pillar is electrically connected to the electrical board, wherein the at least one epitaxial conductive pillar extends through the epitaxial device layer to electrically couple the conductive trace to an interface surface on the epitaxial device layer.

10. The electrical system of claim 9, wherein the at least one epitaxial conductive pillar and the MEMS device are bonded to a plurality of mesas formed on the top surface of the substrate layer, wherein the conductive trace extends from the recessed area to the top surface of a mesa in the plurality of mesas.

\* \* \* \* \*